United States Patent
Kihara

(10) Patent No.: US 10,497,431 B2
(45) Date of Patent: Dec. 3, 2019

(54) STATIC RANDOM-ACCESS MEMORY DEVICE, REDUNDANT CIRCUIT THEREOF, AND SEMICONDUCTOR DEVICE

(71) Applicant: Powerchip Semiconductor Manufacturing Corporation, Hsinchu (TW)

(72) Inventor: Yuji Kihara, Tokyo (JP)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 0 days.

(21) Appl. No.: 15/947,880

(22) Filed: Apr. 9, 2018

(65) Prior Publication Data

US 2019/0156882 A1      May 23, 2019

(30) Foreign Application Priority Data

Nov. 22, 2017 (JP) ................. 2017-224801

(51) Int. Cl.
*G11C 7/00* (2006.01)
*G11C 11/419* (2006.01)
(Continued)

(52) U.S. Cl.
CPC ............. *G11C 11/419* (2013.01); *G11C 8/08* (2013.01); *G11C 8/10* (2013.01); *G11C 11/418* (2013.01); *H01L 27/1116* (2013.01); *G11C 7/12* (2013.01)

(58) Field of Classification Search
CPC ............ G11C 11/419; G11C 7/12; G11C 8/08; G11C 8/10; G11C 11/418; H01L 27/1116
(Continued)

(56) References Cited

U.S. PATENT DOCUMENTS

| | | | | |
|---|---|---|---|---|
| 4,467,449 A | * | 8/1984 | Hayashi | ................. G11C 5/063 |
| 5,351,214 A | * | 9/1994 | Rouy | ..................... G11C 29/02 365/185.21 |

(Continued)

FOREIGN PATENT DOCUMENTS

| | | |
|---|---|---|
| CN | 102163465 | 8/2011 |
| JP | H06012892 | 1/1994 |

(Continued)

*Primary Examiner* — Viet Q Nguyen
(74) *Attorney, Agent, or Firm* — JCIPRNET

(57) ABSTRACT

A redundant circuit for a SRAM device is provided. The redundant circuit includes: a pair of a first transistor and a second transistor, connected between a power source voltage and a power source terminal of each of the input/output memory units, wherein the pair of the first transistor and the second transistor are connected in parallel with each other, and the first transistor has a greater mutual conductance than the second transistor; and a redundancy control circuit configured to detect a voltage of the power source terminal of each of the input/output memory units when the first transistor is turned off and the second transistor is turned on. When the detected voltage of the power source terminal is decreased by a predetermined value or more from a predetermined reference voltage, the input/output memory unit is determined in a defective state, and the input/output memory unit in the defective state is redundantly replaced with a normal input/output memory unit.

9 Claims, 8 Drawing Sheets

(51) Int. Cl.
*G11C 11/418* (2006.01)
*H01L 27/11* (2006.01)
*G11C 8/10* (2006.01)
*G11C 8/08* (2006.01)
*G11C 7/12* (2006.01)

(58) Field of Classification Search
USPC .................................. 365/230.06, 200, 201
See application file for complete search history.

(56) References Cited

U.S. PATENT DOCUMENTS

| | | | | |
|---|---|---|---|---|
| 6,216,246 B1* | 4/2001 | Shau | ................... | G06F 11/1008 |
| | | | | 257/E27.092 |
| 6,348,806 B1* | 2/2002 | Okandan | ............ | G01R 31/2621 |
| | | | | 324/750.3 |
| 6,388,927 B1* | 5/2002 | Churchill | ............. | G11C 29/006 |
| | | | | 365/189.09 |
| 7,447,101 B2* | 11/2008 | Fallah | ................... | G11C 11/417 |
| | | | | 365/154 |
| 10,082,820 B1* | 9/2018 | Kihara | ..................... | G05F 5/00 |
| 2004/0196721 A1 | 10/2004 | Terzioglu | | |
| 2010/0201376 A1* | 8/2010 | Ouyang | ................. | G11C 29/50 |
| | | | | 324/551 |
| 2011/0054856 A1* | 3/2011 | Joshi | ................... | G06F 17/5036 |
| | | | | 703/2 |

FOREIGN PATENT DOCUMENTS

| | | |
|---|---|---|
| JP | H08063996 | 3/1996 |
| JP | H08094718 | 4/1996 |
| JP | H09008247 | 1/1997 |
| JP | H11265579 | 9/1999 |
| JP | 2000021191 | 1/2000 |
| JP | 2000090687 | 3/2000 |
| JP | 2000114384 | 4/2000 |
| JP | 2001006391 | 1/2001 |
| JP | 2001236799 | 8/2001 |
| JP | 2002168921 | 6/2002 |
| JP | 2003016797 | 1/2003 |
| JP | 2008146793 | 6/2008 |
| JP | 2008198160 | 8/2008 |
| JP | 2008199265 | 8/2008 |
| TW | 511097 | 11/2002 |

* cited by examiner

US 10,497,431 B2

STATIC RANDOM-ACCESS MEMORY DEVICE, REDUNDANT CIRCUIT THEREOF, AND SEMICONDUCTOR DEVICE

CROSS-REFERENCE TO RELATED APPLICATION

This application claims the priority benefit of Japanese application serial no. 2017-224801, filed on Nov. 22, 2017. The entirety of the above-mentioned patent application is hereby incorporated by reference herein and made a part of this specification.

BACKGROUND OF THE INVENTION

Field of the Invention

The disclosure relates to a redundant circuit for a static random-access memory (SRAM) device, a SRAM device including the redundant circuit, and a semiconductor device including the SRAM device.

Description of Related Art

In semiconductor storage devices such as a memory integrated circuit (an integrated circuit is hereinafter referred to as an IC), a redundant circuit is added to repair function failures and improve a yield. Here, the redundant circuit is, for example, realized with a tester component such as a memory tester device and a built-in self test (BIST) circuit, and a fuse component.

The fuse component comes in the following types:
(1) a laser fuse;
(2) an electrical fuse; and
(3) a flash memory.

RELATED ART DOCUMENTS

Patent Documents

[Patent Document 1] Japanese Laid-open Publication No. 2008-199265
[Patent Document 2] Japanese Laid-open Publication No. 2008-198160
[Patent Document 3] Japanese Laid-open Publication No. 2008-146793
[Patent Document 4] Japanese Laid-open Publication No. 2003-016797
[Patent Document 5] Japanese Laid-open Publication No. 2002-168921
[Patent Document 6] Japanese Laid-open Publication No. 2001-236799
[Patent Document 7] Japanese Laid-open Publication No. 2001-006391
[Patent Document 8] Japanese Laid-open Publication No. 2000-114384
[Patent Document 9] Japanese Laid-open Publication No. 2000-090687
[Patent Document 10] Japanese Laid-open Publication No. 2000-021191
[Patent Document 11] Japanese Laid-open Publication No. Hei 11-265579
[Patent Document 12] Japanese Laid-open Publication No. Hei 09-008247
[Patent Document 13] Japanese Laid-open Publication No. Hei 08-094718
[Patent Document 14] Japanese Laid-open Publication No. Hei 08-063996
[Patent Document 15] Japanese Laid-open Publication No. Hei 06-012892

Problem to be Solved by the Invention

Issues such as a complicated configuration and high costs are present after the redundant circuit is attached to the memory IC. However, a SRAM device including a redundant circuit formed without using the fuse component is not found in the related art.

SUMMARY OF THE INVENTION

The embodiments of the invention provide a redundant circuit for a SRAM device that has a simple configuration and is inexpensive compared to the related art, a SRAM device including the redundant circuit, and a semiconductor device including the SRAM device.

Solution to the Problem

A redundant circuit for a SRAM device of a first invention is a redundant circuit for a SRAM device as described below. The SRAM device includes a plurality of input/output memory units having SRAM cell arrays. The redundant circuit for the SRAM device includes: a plurality of pairs of first transistors and second transistors respectively connected between a power source voltage and a power source terminal of each of the input/output memory units, wherein each of the pairs of the first transistors and the second transistors are connected in parallel with each other, and the first transistor has a greater mutual conductance than the second transistor; and a redundancy control circuit configured to detect a voltage of the power source terminal of each of the input/output memory units when the first transistor is turned off and the second transistor is turned on, wherein when the detected voltage of the power source terminal is decreased by a predetermined value or more from a predetermined reference voltage, the input/output memory unit is determined in a defective state, and the input/output memory unit in the defective state is redundantly replaced with a normal input/output memory unit.

The redundant circuit for the SRAM device further includes a plurality of volatile storage elements, wherein the plurality of volatile storage elements are disposed corresponding to each of the input/output memory units and keep redundancy information of each of the input/output memory units. When the input/output memory unit is determined to be in the defective state, the redundancy control circuit stores redundancy replacement information indicating the defective state to the volatile storage element corresponding to the input/output memory unit, and then redundantly replaces the input/output memory unit in the defective state with the normal input/output memory unit.

Moreover, in the redundant circuit for the SRAM device, the plurality of volatile storage elements are RS type flip-flops.

In addition, in the redundant circuit for the SRAM device, the redundancy control circuit turns off the first transistor and the second transistor connected to the input/output memory unit in the defective state.

Furthermore, in the redundant circuit for the SRAM device, the redundancy control circuit turns off the first transistor and turns on the second transistor when a power source is connected.

Moreover, in the redundant circuit for the SRAM device, when redundantly replacing the input/output memory unit in the defective state with the normal input/output memory unit, in correspondence relations of the plurality of input/output memory units connected to a plurality of input/output data lines, the redundancy control circuit redundantly replaces the input/output memory unit in the defective state with a higher-rank input/output memory unit adjacent to the input/output memory unit in the defective state, and performs redundancy replacement by sequentially shifting the other higher-rank input/output memory units.

In addition, in the redundant circuit for the SRAM device, when redundantly replacing the input/output memory unit in the defective state with the normal input/output memory unit, in correspondence relations of the plurality of input/output memory units connected to a plurality of input/output data lines, the redundancy control circuit redundantly replaces the input/output memory unit in the defective state with a highest-rank input/output memory unit.

A SRAM device of a second invention includes the redundant circuit for the SRAM device.

A semiconductor device of a third invention includes the SRAM device.

Effect of the Invention

Therefore, according to the redundant circuit for the SRAM device of the embodiments of the invention, since the redundant circuit without a fuse component is realized, it has a simple configuration and is inexpensive compared to the related art. Accordingly, when designing and manufacturing a memory IC chip, the costs and time for designing and developing the fuse are reduced. Moreover, the die size of the memory IC chip is reduced, and the total costs of dies of the memory IC chip are reduced.

DESCRIPTION OF THE EMBODIMENTS

Embodiments of the invention will be described below. The same or identical components are labeled with the same numerals.

As mentioned in the problem in the related art above, issues such as a complicated configuration and high costs are present after the redundant circuit is attached to a memory IC. Specifically, a fuse component configured to realize the redundant circuit of the memory IC has to be independently developed or purchased as intellectual property (IP) from other companies. In that case, sometimes specific structures or specific programs are required, which increases the costs. Moreover, an area of the fuse component cannot be reduced in correspondence to miniaturization. Therefore, when a lot of fuses are used, the increase in area is said to be one of the factors for the increase in the costs. If a redundant circuit without the fuse component can be realized, specific effects, such as reducing the costs and time for designing and developing the fuse component, reducing a die size of the memory IC, and reducing total costs of the memory IC, can then be achieved.

Therefore, regarding a redundant circuit for a SRAM device that has a simple configuration and is inexpensive compared to the related art, a SRAM device including the redundant circuit, and a semiconductor device including the SRAM device, the inventors provide a creation as described below.

Embodiments

Figure 1:
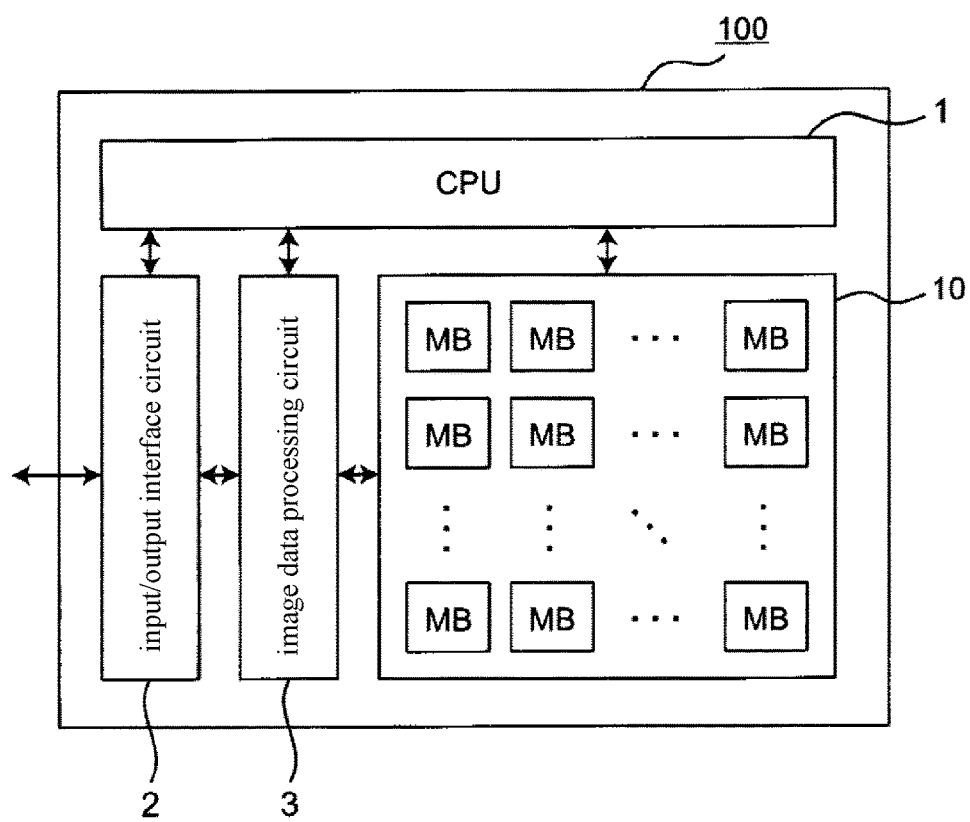
FIG. 1 is a block diagram illustrating a schematic configuration example of an image processing IC 100 according to an embodiment.

FIG. 1 is a block diagram illustrating a schematic configuration example of an image processing IC 100 according to an embodiment. In FIG. 1, the image processing IC 100 is, for example, a driver IC of a liquid crystal display and is configured to include a central processing unit (CPU) 1, an input/output interface circuit 2, an image data processing circuit 3, and a SRAM array 10.

The CPU 1 is a control circuit that controls operations of each of the circuits of the image processing IC 100. Under control of the CPU 1, the input/output interface circuit 2 receives an image data inputted from an external circuit and converts it into predetermined data format and signal format, and outputs it to the image data processing circuit 3. Under control of the CPU 1, the image data processing circuit 3 uses the SRAM array 10 to perform a predetermined image processing on the inputted image data, and then outputs it to an external circuit or an external device via the input/output interface circuit 2. The SRAM array 10 includes a plurality of SRAM memory blocks MB configured in a lattice shape and temporarily stores the image data from the image data processing circuit 3 and outputs it to the image data processing circuit 3.

Figure 2:
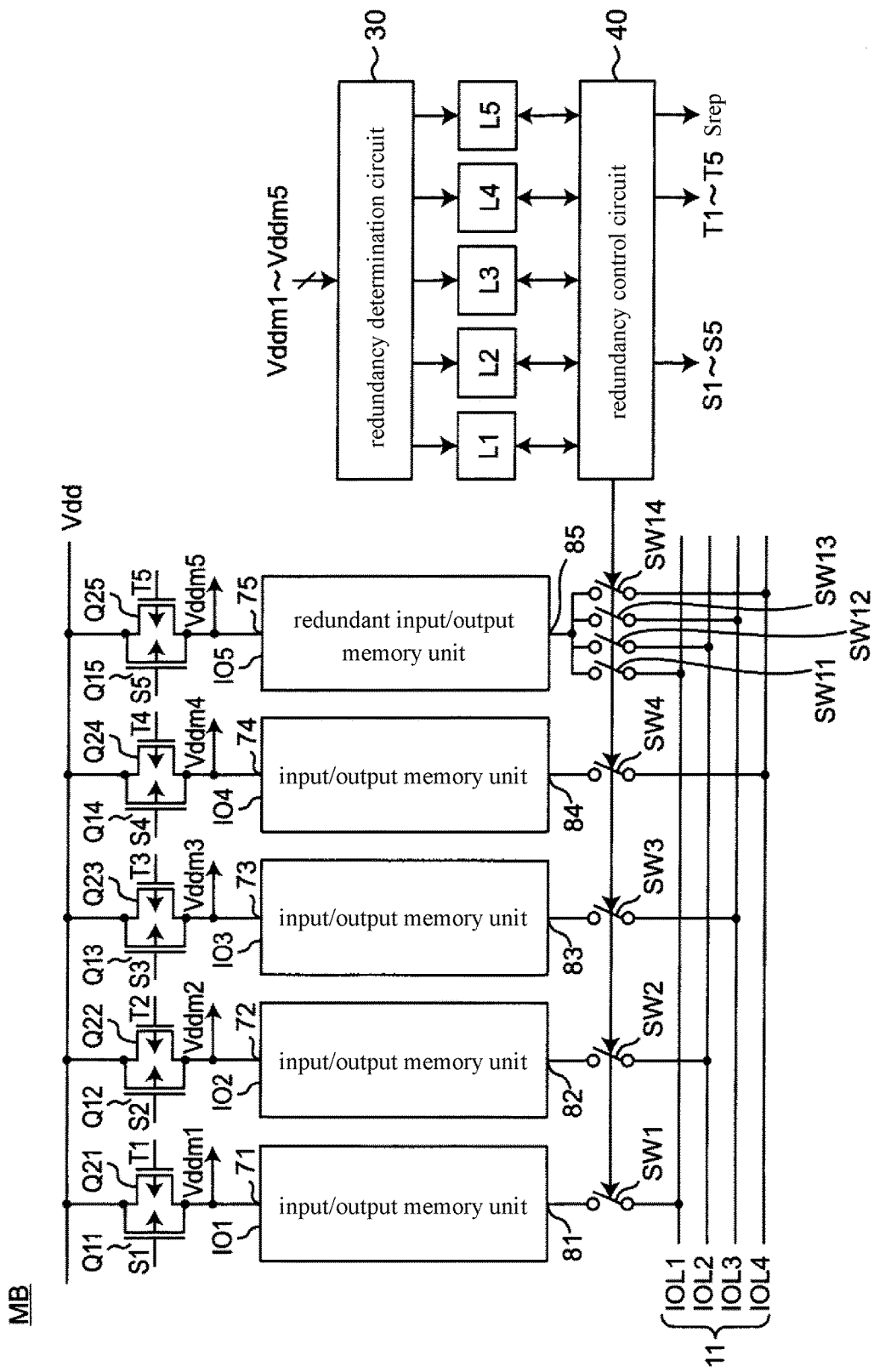
FIG. 2 is a block diagram illustrating a detailed configuration example of a memory block MB of FIG. 1 including a redundant circuit.

FIG. 2 is a block diagram illustrating a detailed configuration example of the memory block MB of FIG. 1 including a redundant circuit. In FIG. 2, the memory block MB is configured to include:

(1) four input/output memory units IO1 to IO4 (hereinafter labeled with IO when collectively referred to);

(2) a redundant input/output memory unit IO5;

(3) a pair of P-channel MOS (metal oxide semiconductor) transistor Q11 and MOS transistor Q21 configured to perform a defect determination on the input/output memory unit IO1;

(4) a pair of P-channel MOS transistor Q12 and MOS transistor Q22 configured to perform a defect determination on the input/output memory unit IO2;

(5) a pair of P-channel MOS transistor Q13 and MOS transistor Q23 configured to perform a defect determination on the input/output memory unit IO3;

(6) a pair of P-channel MOS transistor Q14 and MOS transistor Q24 configured to perform a defect determination on the input/output memory unit IO4;

(7) a pair of P-channel MOS transistor Q15 and MOS transistor Q25 configured to perform a defect determination on the redundant input/output memory unit IO5;

(8) a redundancy determination circuit 30 that respectively performs a defect determination on the input/output memory units IO1 to IO5 based on voltages Vddm1 to Vddm5 of power source terminals 71 to 75 of the input/output memory units IO1 to IO5 to thereby generate a defect determination bit and store it in corresponding latches L1 to L5;

(9) five latches L1 to L5 which are, for example, RS type flip-flops;

(10) eight switches SW1 to SW14 which are, for example, formed of MOS transistors;

(11) an input/output data bus 11 including four input/output data lines IOL1 to IOL4; and

(12) a redundancy control circuit 40, which, under control of the CPU 1 of FIG. 1, turns on or off the eight switches SW1 to SW14 to switch connections between the five input/output memory units IO1 to IO5 and the four input/output data lines IOL1 to IOL4 of the input/output data bus 11.

In addition, in an initial state where the input/output memory units IO1 to IO4 are in a good state (i.e., not in a defective state), the switches SW1 to SW4 are controlled to be turned on, and the switches SW11 to SW14 are controlled to be turned off.

In the memory block MB of FIG. 2, a power source voltage Vdd is connected to the power source terminal 71 of the input/output memory unit IO1 through a source and a drain of the MOS transistor Q11, and is connected to the power source terminal 71 of the input/output memory unit IO1 through a source and a drain of the MOS transistor Q21. Here, the pair of the MOS transistor Q11 and the MOS transistor Q21 are connected in parallel with each other. For example, by configuring a gate width W of the MOS transistor Q11 to be greater than a gate width W of the MOS transistor Q21 (e.g., about 1:5 to 30), a dimension of the MOS transistor Q11 is greater than a dimension of the MOS transistor Q21. Accordingly, a mutual conductance of the MOS transistor Q11 is set to be greater than a mutual conductance of the MOS transistor Q21. Here, the MOS transistor Q21 is provided to maintain a predetermined voltage in a normal writing state of a memory cell MC. A first control signal S1 (a read signal /Read or a stand-by signal /Stand-by) from the redundancy control circuit 40 is inputted to the gate of the MOS transistor Q11, and a second control signal T1 (a write signal /Write or a test-mode signal Stm (FIG. 5)) from the redundancy control circuit 40 is inputted to the gate of the MOS transistor Q21. A data terminal 81 of the input/output memory unit IO1 is connected to the input/output data line IOL1 via the switch SW1.

The power source voltage Vdd is connected to the power source terminal 72 of the input/output memory unit IO2 through a source and a drain of the MOS transistor Q12, and is connected to the power source terminal 72 of the input/output memory unit IO2 through a source and a drain of the MOS transistor Q22. Here, the pair of the MOS transistor Q12 and the MOS transistor Q22 are connected in parallel with each other. For example, by configuring a gate width W of the MOS transistor Q12 to be greater than a gate width W of the MOS transistor Q22 (e.g., about 1:5 to 30), a dimension of the MOS transistor Q12 is greater than a dimension of the MOS transistor Q22. Accordingly, a mutual conductance of the MOS transistor Q12 is set to be greater than a mutual conductance of the MOS transistor Q22. Here, the MOS transistor Q22 is provided to maintain a predetermined voltage in a normal writing state of the memory cell MC. A first control signal S2 (a read signal /Read or a stand-by signal /Stand-by) from the redundancy control circuit 40 is inputted to the gate of the MOS transistor Q12, and a second control signal T2 (a write signal /Write or a test-mode signal Stm (FIG. 5)) from the redundancy control circuit 40 is inputted to the gate of the MOS transistor Q22. A data terminal 82 of the input/output memory unit IO2 is connected to the input/output data line IOL2 via the switch SW2.

The power source voltage Vdd is connected to the power source terminal 73 of the input/output memory unit IO3 through a source and a drain of the MOS transistor Q13, and is connected to the power source terminal 73 of the input/output memory unit IO3 through a source and a drain of the MOS transistor Q23. Here, the pair of the MOS transistor Q13 and the MOS transistor Q23 are connected in parallel with each other. For example, by configuring a gate width W of the MOS transistor Q13 to be greater than a gate width W of the MOS transistor Q23 (e.g., about 1:5 to 30), a dimension of the MOS transistor Q13 is greater than a dimension of the MOS transistor Q23. Accordingly, a mutual conductance of the MOS transistor Q13 is set to be greater than a mutual conductance of the MOS transistor Q23. Here, the MOS transistor Q23 is provided to maintain a predetermined voltage in a normal writing state of the memory cell MC. A first control signal S3 (a read signal /Read or a stand-by signal /Stand-by) from the redundancy control circuit 40 is inputted to the gate of the MOS transistor Q13, and a second control signal T3 (a write signal /Write or a test-mode signal Stm (FIG. 5)) from the redundancy control circuit 40 is inputted to the gate of the MOS transistor Q23. A data terminal 83 of the input/output memory unit IO3 is connected to the input/output data line IOL3 via the switch SW3.

The power source voltage Vdd is connected to the power source terminal 74 of the input/output memory unit IO4 through a source and a drain of the MOS transistor Q14, and is connected to the power source terminal 74 of the input/output memory unit IO4 through a source and a drain of the MOS transistor Q24. Here, the pair of the MOS transistor Q14 and the MOS transistor Q24 are connected in parallel with each other. For example, by configuring a gate width W of the MOS transistor Q14 to be greater than a gate width W of the MOS transistor Q24 (e.g., about 1:5 to 30), a dimension of the MOS transistor Q14 is greater than a dimension of the MOS transistor Q24. Accordingly, a mutual conductance of the MOS transistor Q14 is set to be greater than a mutual conductance of the MOS transistor Q24. Here, the MOS transistor Q24 is provided to maintain a predetermined voltage in a normal writing state of the memory cell MC. A first control signal S4 (a read signal /Read or a stand-by signal /Stand-by) from the redundancy control circuit 40 is inputted to the gate of the MOS transistor Q14, and a second control signal T4 (a write signal /Write or a test-mode signal Stm (FIG. 5)) from the redundancy control circuit 40 is inputted to the gate of the MOS transistor Q24. A data terminal 84 of the input/output memory unit IO4 is connected to the input/output data line IOL4 via the switch SW4.

The power source voltage Vdd is connected to the power source terminal 75 of the redundant input/output memory unit IO5 through a source and a drain of the MOS transistor Q15, and is connected to the power source terminal 75 of the input/output memory unit IO5 through a source and a drain of the MOS transistor Q25. Here, the pair of the MOS transistor Q15 and the MOS transistor Q25 are connected in parallel with each other. For example, by configuring a gate width W of the MOS transistor Q15 to be greater than a gate width W of the MOS transistor Q25 (e.g., about 1:5 to 30), a dimension of the MOS transistor Q15 is greater than a dimension of the MOS transistor Q25. Accordingly, a mutual conductance of the MOS transistor Q15 is set to be greater than a mutual conductance of the MOS transistor Q25. Here, the MOS transistor Q25 is provided to maintain a predetermined voltage in a normal writing state of the memory cell MC. A first control signal S5 (a read signal /Read or a stand-by signal /Stand-by) from the redundancy control circuit 40 is inputted to the gate of the MOS transistor Q15, and a second control signal T5 (a write signal /Write or a test-mode signal Stm (FIG. 5)) from the redundancy control circuit 40 is inputted to the gate of the MOS transistor Q25. A data terminal 85 of the input/output memory unit IO5 is respectively connected to the input/output data lines IOL1 to IOL4 via the switches SW11 to SW14.

The voltages Vddm1 to Vddm5 of the power source terminals 71 to 75 of the input/output memory units IO1 to IO5 are inputted to the redundancy determination circuit 30 to perform a defect determination on the input/output memory units IO1 to IO5.

In the memory block MB configured as described above, the redundancy determination circuit 30 respectively performs a defect determination on the input/output memory units IO1 to IO5 based on the voltages Vddm1 to Vddm5 of the power source terminals 71 to 75 of the input/output memory units IO1 to IO5 according to a method detailed below with reference to FIG. 5 to thereby generate the defect determination bit (redundancy information indicating the defective state) and store it in the corresponding latches L1 to L5.

For example, when determining that the input/output memory unit IO1 is defective, the redundancy determination circuit 30 stores a defective bit "1" indicating redundancy replacement in the latch L1 in place of good bit "0". In response, the redundancy control circuit 40 turns off the switch SW1 and turns on the switch SW11 to use the redundant input/output memory unit IO5 to replace the input/output memory unit IO1.

For example, when determining that the input/output memory unit IO2 is defective, the redundancy determination circuit 30 stores a defective bit "1" indicating redundancy replacement in the latch L2 in place of good bit "0". In response, the redundancy control circuit 40 turns off the switch SW2 and turns on the switch SW12 to use the redundant input/output memory unit IO5 to replace the input/output memory unit IO2.

For example, when determining that the input/output memory unit IO3 is defective, the redundancy determination circuit 30 stores a defective bit "1" indicating redundancy replacement in the latch L3 in place of good bit "0". In response, the redundancy control circuit 40 turns off the switch SW3 and turns on the switch SW13 to use the redundant input/output memory unit IO5 to replace the input/output memory unit IO3.

For example, when determining that the input/output memory unit IO4 is defective, the redundancy determination circuit 30 stores a defective bit "1" indicating redundancy replacement in the latch L4 in place of good bit "0". In response, the redundancy control circuit 40 turns off the switch SW4 and turns on the switch SW14 to use the redundant input/output memory unit IO5 to replace the input/output memory unit IO4.

In other words, in the redundant circuit of FIG. 2, one of the input/output memory units IO1 to IO4 that is in the defective state is redundantly replaced with the input/output memory unit IO5, and a redundancy replacement is performed while correspondence relations of connections of the input/output memory units IO with respect to the input/output data lines IOL1 to IOL4 are maintained (i.e., connected to IOL1 with respect to IO1; connected to IOL2 with respect to IO2; connected to IOL3 with respect to IO3; connected to IOL4 with respect to IO4) with the exception of the one of the input/output memory units IO1 to IO4 that is in the defective state. Moreover, when only the input/output memory unit IO5 is in the defective state, it is also possible not to perform replacement on the entire memory block MB.

Figure 3:
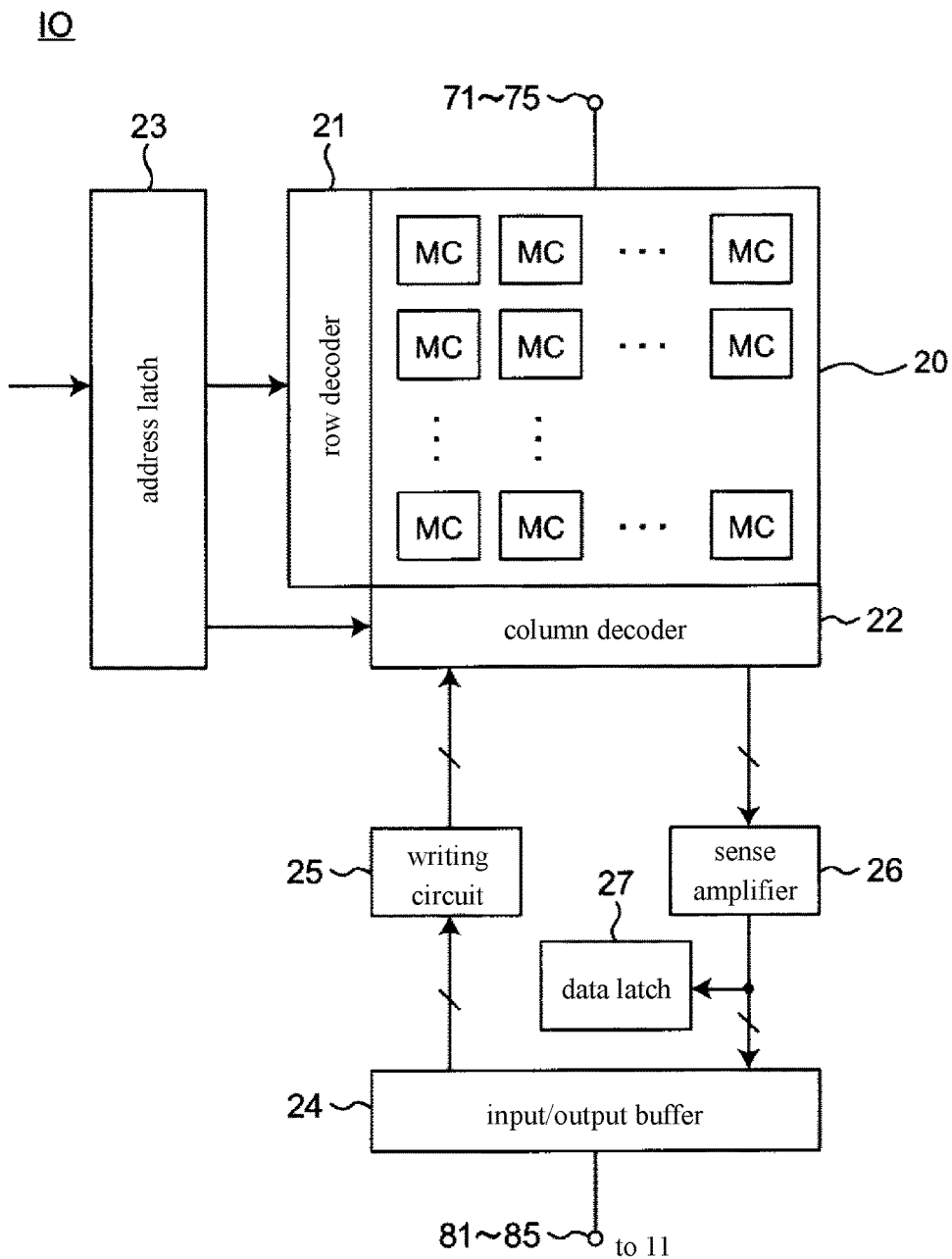
FIG. 3 is a block diagram illustrating a detailed configuration example of input/output memory units IO1 to IO5 (labeled with IO when collectively referred to) of FIG. 2.

FIG. 3 is a block diagram illustrating a detailed configuration example of the input/output memory units IO1 to IO5 (labeled with IO when collectively referred to) of FIG. 2. In FIG. 3, the input/output memory unit IO is configured to include a memory cell array 20, a row decoder 20, a column decoder 22, an address latch 23, an input/output buffer 24, a writing circuit 25, a sense amplifier 26, and a data latch 27.

Figure 4:
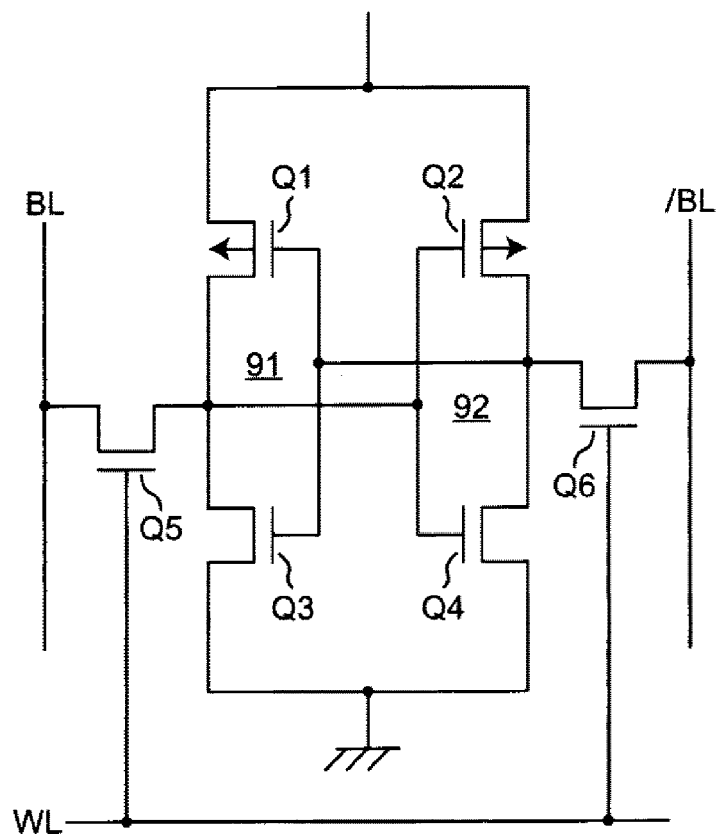
FIG. 4 is a block diagram illustrating a detailed configuration example of a memory cell MC of FIG. 3.

The memory cell array 20 respectively has a configuration of FIG. 4 and is configured to be provided with a plurality of memory cells MC of SRAM in a lattice shape. Here, a predetermined power source voltage is applied to the power source terminals 71 to 75 of the memory cell array 20. The address latch 23 temporarily stores an inputted external address, and then divides it into a row address and a column address. The row address is outputted to the row decoder 21, and on the other hand, the column address is outputted to the column decoder 22. According to the inputted row address, the row decoder 21 applies the predetermined voltage to a predetermined word line WL in the memory cell array 20 to perform selection of the word line.

Moreover, according to the inputted column address, the column decoder 22 opens gates of predetermined bit line BL and bit line /BL in the memory cell array 20 for selection to connect the predetermined bit line BL and bit line /BL to the writing circuit 25 or the sense amplifier 26. Inputted write data is inputted to the writing circuit 25 through the input/output buffer 24, and the writing circuit 25 writes the data to a predetermined memory cell MC in the memory cell array 20 at a predetermined writing time point. On the other hand, after data read from the predetermined memory cell MC in the memory cell array 20 at a predetermined reading time point is amplified by the sense amplifier 26, the data is temporarily stored in the data latch and is then outputted through the input/output buffer 24.

FIG. 4 is a block diagram illustrating a detailed configuration example of the memory cell MC of FIG. 3. In FIG. 4, the memory cell MC is configured to include six MOS transistors Q1 to Q6. Here, an inverter 91 formed of the MOS transistor Q1 and the MOS transistor Q3 and an inverter 92 formed of the MOS transistor Q2 and the MOS transistor Q4 are connected in parallel in directions opposite to each other and form a latch circuit. Here, when selection of the word line WL is performed, the MOS transistor Q5 and the MOS transistor Q6 are turned on, and data is written or read through the bit line BL and the bit line /BL.

Figure 5:
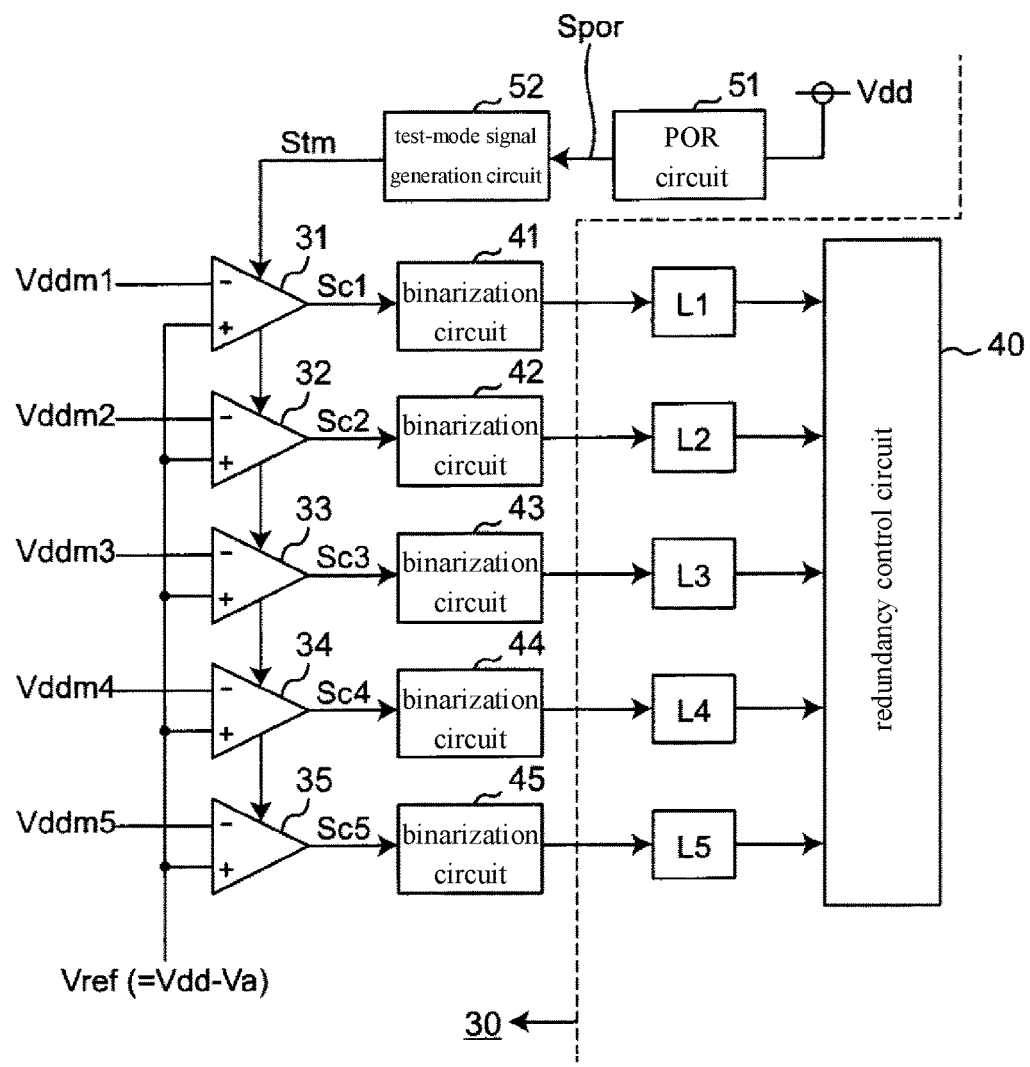
FIG. 5 is a block diagram illustrating a detailed configuration example of a redundancy determination circuit 30 of FIG. 2 and its peripheral circuits.

FIG. 5 is a block diagram illustrating a detailed configuration example of the redundancy determination circuit 30 of FIG. 2 and its peripheral circuits. In FIG. 5, the redundancy determination circuit 30 is configured to include a power-on reset circuit (hereinafter referred to as a POR circuit) 51, a test-mode signal generation circuit 52, five differential amplification circuits 31 to 35, and five binarization circuits 41 to 45.

When detecting a rise from a power-off state to a power-on state based on the power source voltage Vdd, the POR circuit 51 generates a POR reset signal Spor and outputs it to the test-mode signal generation circuit 52. The test-mode signal generation circuit 52 generates a test-mode signal Stm based on the POR reset signal Spor and outputs it to the five differential amplification circuits 31 to 35 to cause the differential amplification circuits 31 to 35 to be in a working state, and applies the test-mode signal Stm as the second control signals T1 to T5 to the MOS transistors Q21 to Q25 of the input/output memory units IO to turn on the MOS transistors Q21 to Q25. Specifically, the MOS transistors Q11 to Q15 are in an off state.

The differential amplification circuits 31 to 35 respectively subtract the inputted voltages Vddm1 to Vddm5 of the power source terminals 71 to 75 from a reference voltage Vref (=Vdd−Va (here, Va is a predetermined determination drop voltage and is, for example, a voltage of 3% to 20% of the power source voltage Vdd)), and respectively output voltage signals Sc1 to Sc5 used as subtraction results to the binarization circuits 41 to 45. The binarization circuits 41 to 45 compares the inputted voltage signals Sc1 to Sc5 used as the subtraction results with a predetermined threshold voltage to binarize them into binary data, and stores the binary data in the corresponding latches L1 to L5. Here, when the input/output memory units IO1 to IO5 are good, the binary data remains "0", and when the input/output memory units IO1 to IO5 are defective, the binary data becomes "1". In the redundancy determination circuit 30 configured as described above, the good/defective states of the input/output memory units IO1 to IO5 are determined and stored in the latches L1 to L5.

In addition, in the present embodiment, regarding a time segment for performing the redundancy determination, it is performed, for example, merely in a predetermined period starting from power connection. However, the disclosure is not limited hereto. It may also be repetitively performed in a predetermined cycle when the SRAM device is not in use after the period is over.

According to the circuit configurations of FIG. 2 and FIG. 5, the following functions/effects are achieved in some exemplary embodiments.

(1) When the input/output memory unit IO including the memory cell array 20 having a plurality of SRAM memory cells MC is in the defective state, a probability of current increase factors, such as short circuits, being present in any one of the memory cells is high, and a current flowing from the power source voltage Vdd becomes greater than a current in the good state. To use this electrical property to discover a timing when the current flowing from the power source voltage Vdd in the input/output memory unit IO has dropped to below the predetermined threshold value, a pair of MOS transistors (Q11, Q21; Q12, Q22; Q13, Q23; Q14, Q24; Q15, Q25) having different sizes (or mutual conductances) are used as a detection circuit to detect a leakage current of the input/output memory unit IO. Specifically, as shown in FIG. 5, based on the voltages Vddm1 to Vddm5 of the power source terminals 71 to 75 of the input/output memory units IO, the differential amplification circuits 31 to 35 and the binarization circuits 41 to 45 are used to detect the defective or failed input/output memory unit IO.

(2) The latches L1 to L5 keep state information of the detected defective or failed input/output memory unit IO.

(3) Moreover, as shown in FIG. 2 and described above, the good input/output memory unit IO is used to redundantly replace the defective or failed input/output memory unit IO.

(4) According to the redundant circuit for the SRAM device, since the redundant circuit is formed without using the fuse component, it has a simple configuration and is inexpensive compared to the related art. Accordingly, when designing and manufacturing the memory IC chip, the costs and time for designing and developing the fuse are reduced. Moreover, the die size of the memory IC chip is reduced, and the total costs of dies of the memory IC chip are reduced.

Figure 6:
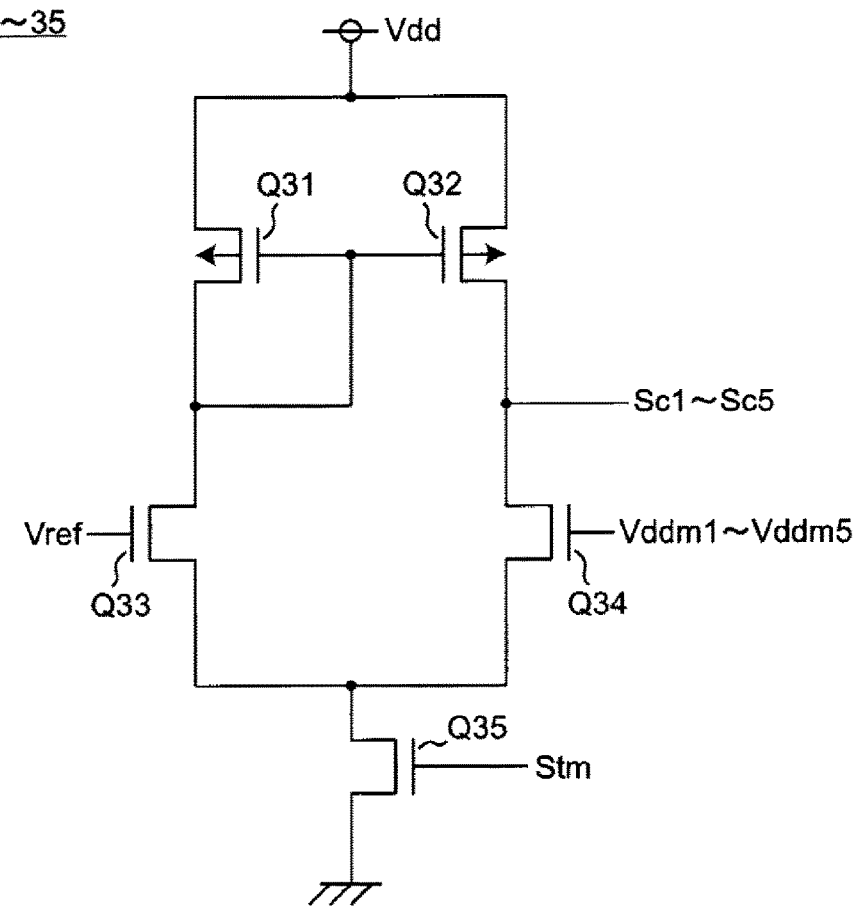
FIG. 6 is a block diagram illustrating a detailed configuration example of differential amplification circuits 31 to 35 of FIG. 5.

FIG. 6 is a block diagram illustrating a detailed configuration example of the differential amplification circuits 31 to 35 of FIG. 5. In FIG. 6, the differential amplification circuits 31 to 35 are formed by further adding a MOS transistor Q35 for a switch for on/off control of operations to a differential amplifier including four MOS transistor Q31 to Q34. The reference voltage Vref is applied to a gate of the MOS transistor Q33. On the other hand, the voltages Vddm1 to Vddm5 of the power source terminals 71 to 75 are applied to a gate of the MOS transistor Q34. When the high-level test-mode signal Stm is applied to a gate of the MOS transistor Q35, the differential amplification circuits 31 to 35 become in the working state and output the voltages Sc1 to Sc5 corresponding to the results obtained by subtracting the voltages Vddm1 to Vddm5 from the reference voltage Vref.

As described above, according to the redundant circuit for the SRAM device of the present embodiment, since the redundant circuit is formed without using the fuse component, it has a simple configuration and is inexpensive compared to the related art. Namely, when designing and manufacturing the memory IC chip, the costs and time for designing and developing the fuse are reduced. Moreover, the die size of the memory IC chip is reduced, and the total costs of dies of the memory IC chip are reduced.

Figure 7:
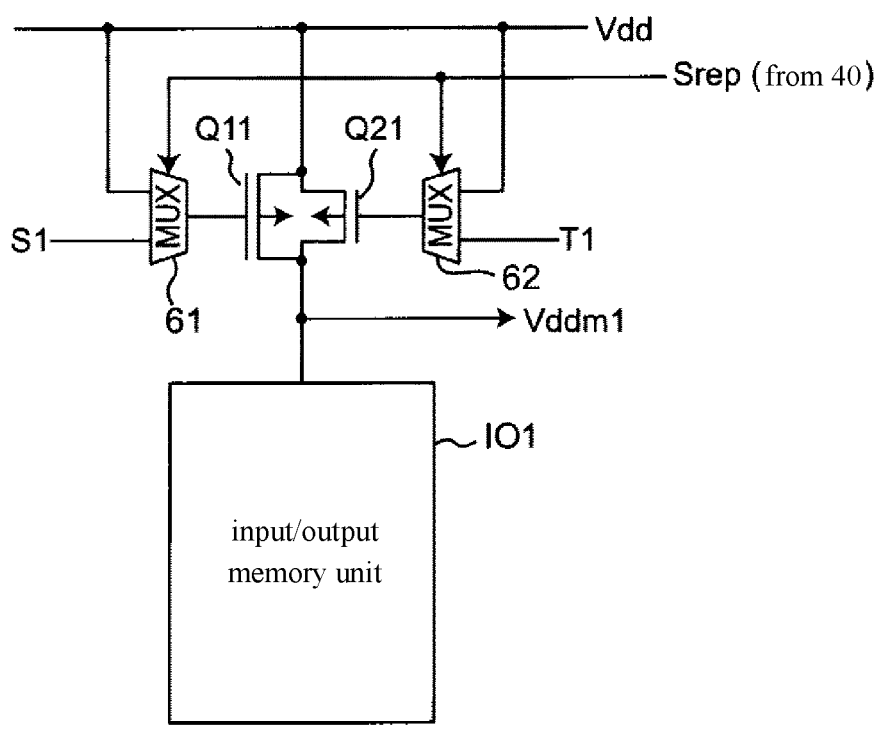
FIG. 7 is a block diagram illustrating a detailed configuration example of peripheral circuits of the input/output memory unit IO1 of FIG. 3 according to Modified Example 1.

FIG. 7 is a block diagram illustrating a detailed configuration example of peripheral circuits of the input/output memory unit IO1 of FIG. 3 according to Modified Example 1.

In FIG. 2, the redundancy control circuit 40 may output a redundancy delay control signal Srep. In FIG. 7, multiplexers 61 and 62 are respectively connected to the gates of the MOS transistors Q11 and Q21. The first control signal S1 is inputted to a first input terminal of the multiplexer 61, the power source voltage Vdd is applied to a second input terminal of the multiplexer 61. When the input/output memory unit IO1 is good, the multiplexer 61 selects the first control signal S1 and applies it to the gate of the MOS transistor Q11. On the other hand, when the input/output memory unit IO1 is defective, the multiplexer 61 selects the power source voltage Vdd based on the redundancy delay control signal Srep from the redundancy control circuit 40 and applies it to the gate of the MOS transistor Q11 to turn off the MOS transistor Q11. Accordingly, when the input/output memory unit IO1 is defective, it is possible to prevent a consumption current unnecessary for the input/output memory unit IO1 from flowing to the input/output memory unit IO1.

Moreover, in Modified Example 1, the other input/output memory units IO2 to IO5 are configured in the same manner and are operated in the same manner.

Figure 8:
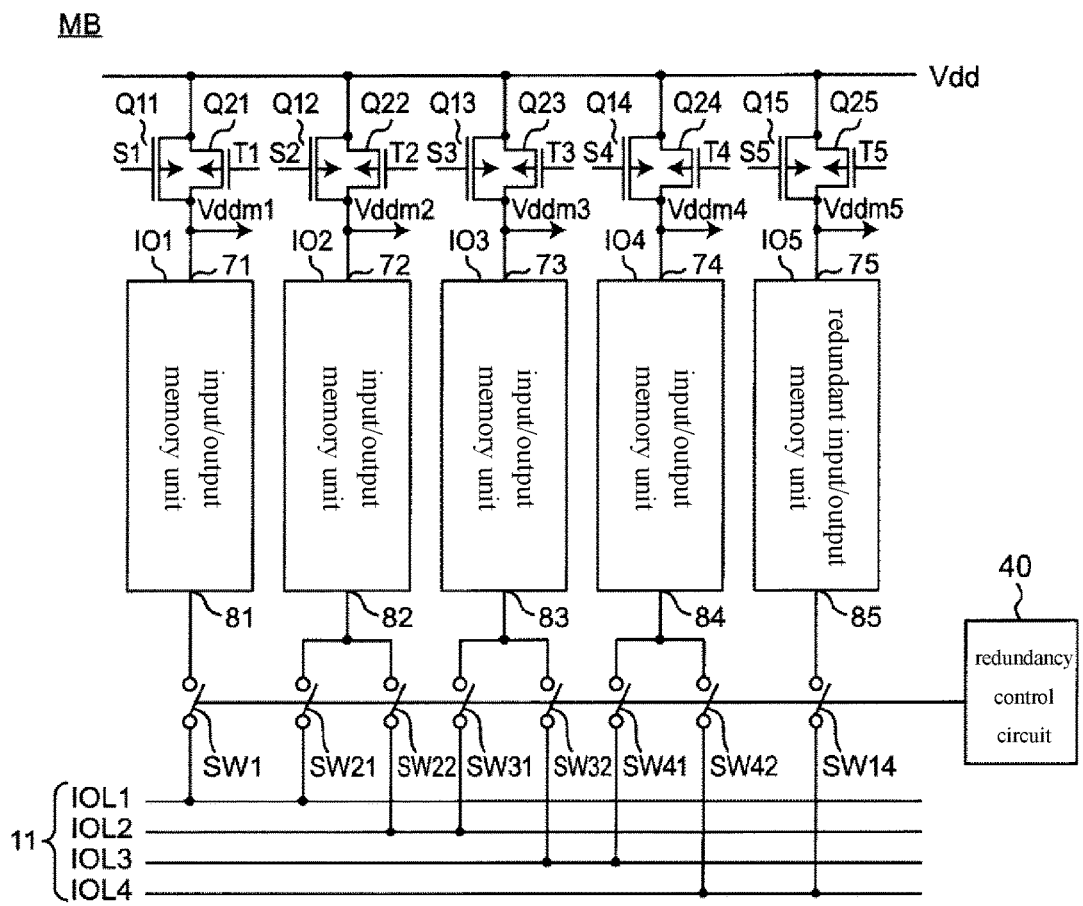
FIG. 8 is a block diagram illustrating a detailed configuration example of peripheral circuits of the input/output memory units IO1 to IO5 of FIG. 2 according to Modified Example 2.

FIG. 8 is a block diagram illustrating a detailed configuration example of peripheral circuits of the input/output memory units IO1 to IO5 of FIG. 2 according to Modified Example 2. When the input/output memory units IO1 to IO4 are defective, a switch SW1 is turned on, a switch SW21 is turned off and a switch SW22 is turned on, a switch SW31 is turned off and a switch SW32 is turned on, a switch SW41 is turned off and a switch SW42 is turned on, and the switches SW11 to SW14 are turned off.

In FIG. 8, the data terminal 81 of the input/output memory unit IO1 is connected to the input/output data line IOL1 via the switch SW1. The data terminal 82 of the input/output memory unit IO2 is connected to the input/output data line IOL1 via the switch SW21 and is connected to the input/output data line IOL2 via the switch SW22. The data terminal 83 of the input/output memory unit IO3 is connected to the input/output data line IOL2 via the switch SW31 and is connected to the input/output data line IOL3 via the switch SW32. The data terminal 84 of the input/output memory unit IO4 is connected to the input/output data line IOL3 via the switch SW41 and is connected to the input/output data line IOL4 via the switch SW42. The data terminal 85 of the input/output memory unit IO5 is respectively connected to the input/output data line IOL4 via the switch SW14.

Here, when the redundancy determination circuit 30 determines that the input/output memory unit IO1 is defective, for example, the switch SW1 is turned off, the switch SW21 is turned on and the switch SW22 is turned off, the switch SW31 is turned on and the switch SW32 is turned off, the switch SW41 is turned on and the switch SW42 is turned off, and the switch SW14 is turned on. Accordingly, the input/output memory unit IO2 is used to replace the input/output memory unit IO1, the input/output memory unit IO3 is used to replace the input/output memory unit IO2, the input/output memory unit IO4 is used to replace the input/output memory unit IO3, and the input/output memory unit IO5 is used to replace the input/output memory unit IO4.

Moreover, when the redundancy determination circuit 30 determines that the input/output memory unit IO2 is defective, the switch SW21 and the switch SW22 are both turned off, the switch SW31 is turned on and the switch SW32 is turned off, the switch SW41 is turned on and the switch SW42 is turned off, and the switch SW14 is turned on. Accordingly, the input/output memory unit IO3 is used to replace the input/output memory unit IO2, the input/output memory unit IO4 is used to replace the input/output memory unit IO3, and the input/output memory unit IO5 is used to replace the input/output memory unit IO4.

In addition, when the redundancy determination circuit 30 determines that the input/output memory unit IO3 is defective, the switch SW31 and the switch SW32 are both turned off, the switch SW41 is turned on and the switch SW42 is turned off, and the switch SW14 is turned on. Accordingly, the input/output memory unit IO4 is used to replace the input/output memory unit IO3, and the input/output memory unit IO5 is used to replace the input/output memory unit IO4.

Furthermore, when the redundancy determination circuit 30 determines that the input/output memory unit IO4 is defective, the switch SW41 and the switch SW42 are both turned off, and the switch SW14 is turned on. Accordingly, the input/output memory unit IO5 is used to replace the input/output memory unit IO4.

In other words, in the redundant circuit of FIG. 8, one of the input/output memory units IO1 to IO4 that is in the defective state is redundantly replaced with the input/output memory unit IO labeled with a larger numeral. The redundantly replaced input/output memory unit IO of the larger numeral sequentially shifts the number of the input/output memory unit IO to an even larger number by way of selecting among the input/output data lines IOL2 to IOL4 of an even larger numeral on the correspondence relations connecting the input/output memory units IO with respect to the input/output data lines IOL1 to IOL4 (i.e., connected to IOL1 with respect to IO1; connected to IOL2 with respect to IO2; connected to IOL3 with respect to IO3; connected to 10L4 with respect to IO4).

The number of the switches SW1 to SW14 of the redundant circuit of FIG. 2 is identical to the number of the switches SW1 to SW42 of the redundant circuit of FIG. 8, but whether the correspondence relations are shifted to higher numerals for performing redundancy replacement is different.

In the embodiments above, the image processing IC 100 is described. However, the embodiments of the invention are not limited hereto and may be generally applied to semiconductor ICs such as a system on chip (SoC) IC including a processor and a SRAM array.

In the embodiments above, the redundancy information is temporarily stored in the latches L1 to L5, but the embodiments of the invention are not limited hereto. The redundancy information may also be stored in other volatile storage elements.

Differences between the embodiments of the invention and Patent Documents 1 to 15 are described below.

(1) Differences from Patent Document 1 (Japanese Laid-open Publication No. 2008-199265):

In a semiconductor integrated circuit of Patent Document 1, a redundant circuit utilizing antifuses is used. Writing of the antifuses requires long-pulse and long-cycle fuse writing control signals. However, due to the performance of a tester, long-cycle signals cannot be generated, and there is an issue that the tester cannot be effectively utilized. To address this issue, an internal signal generation circuit is disposed inside the semiconductor integrated circuit, and the internal signal generation circuit uses short-pulse signals from the tester to generate the long-pulse and long-cycle fuse writing control signals. Through the long-pulse and long-cycle fuse writing control signals generated by the internal signal generation circuit, writing to the antifuses is realized without being limited by the performance of the tester. Therefore, the tester can be effectively utilized.

In other words, Patent Document 1 uses the redundant circuit utilizing antifuses. On the other hand, in the embodiments of the invention, without using the antifuses, a pair of MOS transistors are used to determine the defective state of the input/output memory unit IO and perform redundancy replacement when the power source is connected.

(2) Differences from Patent Document 2 (Japanese Laid-open Publication No. 2008-198160):

In a detection method of a redundant circuit of Patent Document 2, the redundant circuit is automatically detected in a designed logical circuit. Specifically, a circuit structure analysis component analyzes a structure of a to-be-verified logical circuit portion in the logical circuit stored in a storage component, and detects pulses branched from an input signal of the logical circuit portion to separate any one of the branched pulses from the input signal and add a pseudo terminal that sets another input signal in a pseudo manner for the separated pulse. A binary decision diagram generation component generates a binary decision diagram of the logical circuit portion including the pseudo terminal. A redundant circuit detection component verifies the generated binary decision diagram to look for an inconsistent portion and detects the pulse of the logical circuit portion corresponding to the inconsistent portion as a redundant circuit.

In other words, in Patent Document 2, a redundancy information keeping component is not specifically recited. On the other hand, in the embodiments of the invention, without using the fuse component, a pair of MOS transistors are used to determine the defective state of the input/output memory unit IO and perform redundancy replacement when the power source is connected.

(3) Differences from Patent Document 3 (Japanese Laid-open Publication No. 2008-146793):

Patent Document 3 discloses a circuit for determining whether a plurality of redundant read only memory (ROM) circuits are programmed in a predetermined sequence correlated with addresses, and a semiconductor device including the circuit. Specifically, n redundant ROM circuits are included. The n redundant ROM circuits store a redundantly replaced address according to whether the fuse blows and output a redundancy selection signal when an access address and the redundantly replaced address are consistent. Under a condition that a repair address is programmed according to a sequence of n redundant storage circuits in an ascending order of magnitude of address values, when it is detected that a redundancy selection signal is outputted from a $(i+1)^{th}$ redundant storage circuit in a case where the redundancy selection signal is not outputted from a $i^{th}$ redundant ROM circuit, a SR type flip-flop is set and replacement determination output is set in a reverse order.

In other words, Patent Document 3 uses the redundant circuit utilizing fuses. On the other hand, in the embodiments of the invention, without using the fuses, a pair of MOS transistors are used to determine the defective state of the input/output memory unit IO and perform redundancy replacement when the power source is connected.

(4) Differences from Patent Document 4 (Japanese Laid-open Publication No. 2003-016797):

Patent Document 4 aims to provide a semiconductor device capable of setting a pre-processing state or a different processing state for a redundant relief circuit irrespective of fuse processing. The semiconductor device includes: a fuse block that stores switching data of redundant circuits; a data setting circuit formed of a scan shift FF, wherein the scan shift FF is capable of inputting a plurality of data in series from an external terminal in a test mode and outputting data in parallel inside the semiconductor device and is capable of performing scan shift operations; a data switching circuit that inputs data stored in the fuse block and output data from the data setting circuit, and switches and outputs the data; and a redundant relief address comparison circuit that receives the output from the data switching circuit as an input.

In other words, Patent Document 4 uses the redundant circuit utilizing the fuse block. On the other hand, in the embodiments of the invention, without using the fuse block, a pair of MOS transistors are used to determine the defective state of the input/output memory unit IO and perform redundancy replacement when the power source is connected.

(5) Differences from Patent Document 5 (Japanese Laid-open Publication No. 2002-168921):

In Patent Document 5, an object is miniaturization of a semiconductor memory detection device. In the semiconductor memory detection device, one input terminal of a plurality of AND circuits is connected in series, and defect information G <0> to G <5> kept in a register circuit is inputted to another input terminal. By changing values of a plurality of AND circuits connected to a direction (upper bit side) closer to an output side than an AND circuit to which a defective bit is inputted and values of a plurality of AND circuits connected to a direction (lower bit side) closer to an input side than the AND circuit to which the defective bit is inputted, connection of a signal line of the defective bit is removed and connection is switched to an adjacent signal line and a spare line by using a plurality of selectors. Accordingly, it is possible to compensate for the defective bit through an extremely simple configuration.

In other words, in Patent Document 5, a redundancy information keeping component is not specifically recited. On the other hand, in the embodiments of the invention, without using the fuse component, a pair of MOS transistors are used to determine the defective state of the input/output memory unit IO and perform redundancy replacement when the power source is connected.

(6) Differences from Patent Document 6 (Japanese Laid-open Publication No. 2001-236799):

In Patent Document 6, it is an object that a problematic fuse component can be easily confirmed in a case of an issue arising from fuse component processing. In a testing method of a semiconductor device, a data setting circuit is disposed. The data setting circuit inputs a plurality of data in series from an external input terminal in a specific test mode and outputs data in parallel. Moreover, a data comparison circuit is disposed. The data comparison circuit inputs data stored in a fuse block configured to store data required for switching a redundant circuit and an output data from the data setting circuit, and compares the data and outputs a comparison result in a form of parallel data. Furthermore, a data output circuit is disposed. The data output circuit is capable of setting the parallel data output from the data comparison circuit as a parallel input and outputting it to an external output terminal in series.

In other words, Patent Document 6 uses the redundant circuit utilizing the fuse block. On the other hand, in the embodiments of the invention, without using the fuse block, a pair of MOS transistors are used to determine the defective state of the input/output memory unit IO and perform redundancy replacement when the power source is connected.

(7) Differences from Patent Document 7 (Japanese Laid-open Publication No. 2001-006391):

Patent Document 7 aims to address the following issue: in a case of incorporating a redundant circuit, memory cells corresponding to a number of words of a random access memory (RAM) is increased when the redundant circuit cannot be applied to those with completed layout designs but is incorporated. A semiconductor integrated circuit device includes: a RAM including a plurality of memory cell groups having a number of memory cells equal to a number of words, and a plurality of RAMs as redundant circuits including a memory cell group having a number of memory cells equal to or less than a number of words of the RAM. One of data of a first RAM and data of the other RAMs is selected by a selection circuit, and the other RAMs as the redundant circuits are used.

In other words, in Patent Document 7, a redundancy information keeping component is not specifically recited. On the other hand, in the embodiments of the invention, without using the fuse component, a pair of MOS transistors are used to determine the defective state of the input/output memory unit IO and perform redundancy replacement when the power source is connected.

(8) Differences from Patent Document 8 (Japanese Laid-open Publication No. 2000-114384):

Patent Document 8 aims to reduce a number of round-about wirings in a semiconductor device. In the semiconductor device, a macro cell including a fuse circuit and a pre-decoder to which an output of the fuse circuit is supplied is disposed on a peripheral portion of a semiconductor chip. The fuse circuit includes a plurality of fuse circuit units each including a fuse and outputting a signal corresponding to whether the fuse is disconnected. A macro cell including a main decoder to which an output of the pre-decoder is supplied, a signal conversion circuit which converts an output signal of the main decoder to generate a switching signal, and a memory circuit is disposed at an inner side on the semiconductor chip. The memory circuit includes: a plurality of memory blocks having the same configuration as each other, a redundant memory block having the same configuration as the memory blocks, and a switching circuit that turns a defective memory block among the plurality of memory blocks into a non-use state and turns the redundant memory block into a use state in response to the switching signal.

In other words, Patent Document 8 uses the redundant circuit utilizing the fuse. On the other hand, in the embodiments of the invention, without using the fuse block, a pair of MOS transistors are used to determine the defective state of the input/output memory unit IO and perforin redundancy replacement when the power source is connected.

(9) Differences from Patent Document 9 (Japanese Laid-open Publication No. 2000-090687):

In Patent Document 9, it is aimed to operate normally in a semiconductor storage device including a column redundant circuit even if a number of inputted/outputted bits is large. The disclosed semiconductor storage device includes: a plurality of memory cell columns including a plurality of memory cells; a redundant memory cell; a plurality of input/output lines; a plurality of switches disposed corresponding to the plurality of input/output lines, and connecting any one of the adjacent memory cell columns to the corresponding input/output line according to a control voltage; a plurality of fuses in which a power source voltage Vcc is applied to one terminal connected in series, a potential of another terminal is fixed to the power source voltage Vcc or a ground potential GND, and a voltage at a common connection point is respectively supplied to the plurality of switches as the control voltage; and a plurality of control voltage fixing circuits that fix the control voltage of the plurality of switches to a high level or a low level.

In other words, Patent Document 9 uses the redundant circuit utilizing the fuse. On the other hand, in the embodiments of the invention, without using the fuse block, a pair of MOS transistors are used to determine the defective state of the input/output memory unit IO and perform redundancy replacement when the power source is connected.

(10) Differences from Patent Document 10 (Japanese Laid-open Publication No. 2000-021191):

Patent Document 10 aims to provide an effective programming fuse circuit which does not generate unnecessary currents at all. The fuse circuit includes: a fuse component connected between a first potential supply circuit and a second potential supply circuit and disconnected by a laser beam as required for programming; and a holding/driver circuit connected to a contact point, wherein with a first initialization signal 104 generated at the time of setting an operation mode of the device, the fuse circuit supplies a first potential to the contact point by a first potential supply device, and with a second initialization signal generated at the time of setting the operation mode of the device, supplies a second potential to the contact point by a second potential supply device, and the holding/driver circuit holds the potential of the contact point determined as one of the first potential and the second potential and outputs the potential.

In other words, Patent Document 10 uses the redundant circuit utilizing the fuse circuit. On the other hand, in the embodiments of the invention, without using the fuse block, a pair of MOS transistors are used to determine the defective state of the input/output memory unit IO and perform redundancy replacement when the power source is connected.

(11) Differences from Patent Document 11 (Japanese Laid-open Publication No. Hei 11-265579):

Patent Document 11 aims to address the following issue: access cannot be accelerated because a decoding time of current semiconductor storage devices is slow. Since it is difficult to shorten a reset time, a cycle time cannot be accelerated. A semiconductor storage device is configured to include: a memory cell array; an address decoder that decodes an address signal; a word driver that selectively drives a word line in the memory cell array based on decoding information outputted from the address decoder; and a latch portion connected between the address decoder and the word driver to keep the decoding information and supply the decoding information to the word driver.

In other words, in Patent Document 11, a redundancy information keeping component is not specifically recited. On the other hand, in the embodiments of the invention, without using the fuse component, a pair of MOS transistors are used to determine the defective state of the input/output memory unit IO and perform redundancy replacement when the power source is connected.

(12) Differences from Patent Document 12 (Japanese Laid-open Publication No. Hei 09-008247):

Patent Document 12 aims to provide a semiconductor storage device which improves practical usability in a signal processing device for performing data processing or the like. The semiconductor storage device includes a plurality of memory mats formed by disposing memory cells including an information storage capacitor having a ferroelectric film and an address selection MOS field-effect transistor (FET) in a matrix at intersections of word lines and bit lines. A potential of a plate electrode formed by commonly using one electrode of the information storage capacitors formed in the memory mats is programmed to a first voltage or a second voltage. The first voltage does not induce polarization inversion in the ferroelectrics irrespective of a binary writing signal transmitted to a bit line connected with the memory cell, and the second voltage induces polarization inversion in the ferroelectrics corresponding to the binary writing signal transmitted to the bit line connected with the memory cell. Accordingly, since a nonvolatile portion and a volatile portion inside a semiconductor storage device can be set to be programmable corresponding to the type of processed data, it is only necessary to store the data corresponding to a determined storage area. Therefore, the semiconductor storage device having good usability and nonvolatile storage functions can be obtained.

In other words, in Patent Document 12, a redundancy information keeping component is not specifically recited. On the other hand, in the embodiments of the invention, without using the fuse component, a pair of MOS transistors are used to determine the defective state of the input/output memory unit IO and perform redundancy replacement when the power source is connected.

(13) Differences from Patent Document 13 (Japanese Laid-open Publication No. Hei 08-094718):

Patent Document 13 is characterized by miniaturization of a semiconductor memory detection device. In the semiconductor memory detection device, one input terminal of a plurality of AND circuits is connected in series, and defect information G <0> to G <5> kept in a register circuit is inputted to another input terminal. By changing values of AND circuits connected to a direction (upper bit side) closer to an output side than an AND circuit to which a defective bit is inputted and values of AND circuits connected to a direction (lower bit side) closer to an input side than the AND circuit to which the defective bit is inputted, connection of a signal line of the defective bit is removed and connection is switched to an adjacent signal line and a spare line by using selectors. Accordingly, it is possible to compensate for the defective bit through an extremely simple configuration.

In other words, in Patent Document 13, a redundancy information keeping component is not specifically recited. On the other hand, in the embodiments of the invention, without using the fuse component, a pair of MOS transistors are used to determine the defective state of the input/output memory unit IO and perform redundancy replacement when the power source is connected.

(14) Differences from Patent Document 14 (Japanese Laid-open Publication No. Hei 08-063996):

Patent Document 14 aims to provide a technique for suppressing a chip occupation area of a redundant decoder as much as possible even when a capacity of a semiconductor storage device is increased and a number of redundant relief lines is increased accordingly. In the semiconductor storage device, match comparison circuits CAM00 to CAMi-1n-1 are formed. The match comparison circuits CAM00 to CAMi-1n-1 include a flip-flop positioned based on a redundant address stored in an EPROM (erasable programmable read only memory) cell, and MOS transistors configured to perform bit unit comparison on a redundant address and an inputted address according to a positioned state of the flip-flop. By disposing a plurality of the match comparison circuits in a row direction and a column direction corresponding to a bit configuration of the inputted address and a number of redundant word lines, an efficient layout of the redundant decoder is achieved.

In other words, in Patent Document 14, a redundancy information keeping component is not specifically recited. On the other hand, in the embodiments of the invention, without using the fuse component, a pair of MOS transistors are used to determine the defective state of the input/output memory unit IO and perform redundancy replacement when the power source is connected.

(15) Differences from Patent Document 15 (Japanese Laid-open Publication No. Hei 06-012892):

In Patent Document 15, it is an object to reduce a configuration area of a fuse or the like for providing redundancy in the device in a semiconductor storage device selecting a memory cell by using a ring pointer and including a redundant circuit. The semiconductor storage device forms the ring pointer by using a flip-flop circuit and a flip-flop circuit disposed with a data through circuit therein. The flip-flop circuit is controlled by a control circuit so that data is passed through by the data through circuit of the unnecessary flip-flop circuit so that the memory cell 7 unnecessary for the flip-flop circuit is not selected. The control circuit generates a control signal through a selection signal generation component formed of fuses or the like and a decoding portion. Accordingly, a flip-flop selection signal is decoded in the decoding portion, so a number of fuses or the like can be reduced.

In other words, Patent Document 15 uses the redundant circuit utilizing the fuse or the like. On the other hand, in the embodiments of the invention, without using the fuse block, a pair of MOS transistors are used to determine the defective state of the input/output memory unit IO and perform redundancy replacement when the power source is connected.

INDUSTRIAL APPLICABILITY

As described above, according to the redundant circuit for the SRAM device of the embodiments of the invention, since the redundant circuit is formed without using the fuse component, it has a simple configuration and is inexpensive compared to the related art. Accordingly, when designing and manufacturing the memory IC chip, the costs and time for designing and developing the fuse are reduced. Moreover, the die size of the memory IC chip is reduced, and the total costs of dies of the memory IC chip are reduced.

What is claimed is:

1. A redundant circuit for a static random-access memory device, the static random-access memory device comprising a plurality of input/output memory units having static random-access memory cell arrays, the redundant circuit for the static random-access memory device comprising:

a plurality of pairs of first transistors and second transistors respectively connected between a power source voltage and a power source terminal of each of the input/output memory units, wherein each of the pairs of the first transistors and the second transistors are connected in parallel with each other, and the first transistor has a greater mutual conductance than the second transistor; and a redundancy control circuit configured to detect a voltage of the power source terminal of each of the input/output memory units when all of the pairs of the first transistors are turned off and all of the pairs of the second transistors are turned on, wherein when the detected voltage of the power source terminal is decreased by a predetermined value or more from a predetermined reference voltage, the input/output memory unit is determined in a defective state, and the input/output memory unit in the defective state is redundantly replaced with a normal input/output memory unit.

2. The redundant circuit for the static random-access memory device according to claim 1, further comprising a plurality of volatile storage elements, wherein the plurality of volatile storage elements are disposed corresponding to each of the input/output memory units and keep redundancy information of each of the input/output memory units, wherein when the input/output memory unit is determined to be in the defective state, the redundancy control circuit stores the redundancy information indicating the defective state to the volatile storage element corresponding to the input/output memory unit, and then redundantly replaces the input/output memory unit in the defective state with the normal input/output memory unit.

3. The redundant circuit for the static random-access memory device according to claim 2, wherein the plurality of volatile storage elements are RS type flip-flops.

4. The redundant circuit for the static random-access memory device according to claim 1, wherein the redundancy control circuit turns off the first transistor and the second transistor connected to the input/output memory unit in the defective state.

5. The redundant circuit for the static random-access memory device according to claim 1, wherein the redundancy control circuit turns off all of the pairs of the first transistors and turns on all of the pairs of the second transistors when a power source is connected.

6. The redundant circuit for the static random-access memory device according to claim 1, wherein when redundantly replacing the input/output memory unit in the defective state with the normal input/output memory unit, in correspondence relations of the plurality of input/output memory units connected to a plurality of input/output data lines, the redundancy control circuit redundantly replaces the input/output memory unit in the defective state with a higher-rank input/output memory unit adjacent to the input/output memory unit in the defective state, and performs redundancy replacement by sequentially shifting the other higher-rank input/output memory units.

7. The redundant circuit for the static random-access memory device according to claim 1, wherein when redundantly replacing the input/output memory unit in the defective state with the normal input/output memory unit, in correspondence relations of the plurality of input/output memory units connected to a plurality of input/output data lines, the redundancy control circuit redundantly replaces the input/output memory unit in the defective state with a highest-rank input/output memory unit.

8. A static random-access memory device comprising:
the redundant circuit for the static random-access memory device according to claim 1.

9. A semiconductor device comprising:
the static random-access memory device according to claim 8.

* * * * *